United States Patent
Alberto et al.

(10) Patent No.: US 10,690,713 B2
(45) Date of Patent: Jun. 23, 2020

(54) METHOD OF DETECTING AN ELECTRIC ARC BY ANALYSIS OF ITS ACOUSTIC SIGNATURE

(71) Applicants: Commissariat à l'Energie Atomique et aux Energies Alternatives, Paris (FR); SAFRAN ELECTRICAL & POWER, Blagnac (FR)

(72) Inventors: Diego Alberto, Fontaine (FR); Vincent Heiries, Saint-Jean de Moirans (FR); Pierre Perichon, Voiron (FR); Jérôme Genoulaz, Blagnac (FR)

(73) Assignees: Commissariat à l'Energie Atomique et aux Energies Alternatives, Paris (FR); Safran Electrical & Power, Blagnac (FR)

( * ) Notice: Subject to any disclaimer, the term of this patent is extended or adjusted under 35 U.S.C. 154(b) by 0 days.

(21) Appl. No.: 15/390,510

(22) Filed: Dec. 25, 2016

(65) Prior Publication Data
US 2017/0184655 A1 Jun. 29, 2017

(30) Foreign Application Priority Data
Dec. 28, 2015 (FR) ...................... 15 63381

(51) Int. Cl.
*G01R 31/12* (2020.01)
*G01H 17/00* (2006.01)
(Continued)

(52) U.S. Cl.
CPC .......... *G01R 31/1209* (2013.01); *G01H 1/00* (2013.01); *G01H 17/00* (2013.01); *H02H 1/0023* (2013.01)

(58) Field of Classification Search
CPC .......... G01R 31/1209; G01R 31/1272; H02H 1/0023; G01H 17/00
See application file for complete search history.

(56) References Cited

U.S. PATENT DOCUMENTS

| | | | |
|---|---|---|---|
| 4,677,363 A | * | 6/1987 | Kopmann .......... G01R 31/3631 320/131 |
| 5,882,492 A | | 3/1999 | Manley et al. |

(Continued)

FOREIGN PATENT DOCUMENTS

| | | |
|---|---|---|
| CN | 204441661 U | 7/2015 |
| FR | 2983968 | 6/2013 |

(Continued)

OTHER PUBLICATIONS

Preliminary Search Report in French Patent Application No. 1563381; dated Oct. 27, 2016, 1 page.

(Continued)

*Primary Examiner* — Akm Zakaria
(74) *Attorney, Agent, or Firm* — Moreno IP Law LLC

(57) ABSTRACT

A method of detecting an electric arc in an electrical system from a signal originating from at least one sensor detecting acoustic waves in the system, including: a) calculating by means of a processing device, over a sliding window of signal samples, at least one statistical parameter selected from the skewness and the kurtosis of the signal; b) detecting a possible occurrence of an event by taking into account said at least one statistical parameter; and c) performing a frequency analysis of the signal enabling to identify an electric arc when an event is detected at step b).

10 Claims, 1 Drawing Sheet

(51) Int. Cl.
*G01H 1/00* (2006.01)
*H02H 1/00* (2006.01)

(56) References Cited

U.S. PATENT DOCUMENTS

| | | | |
|---|---|---|---|
| 6,215,408 B1* | 4/2001 | Leonard | G01R 31/3274 324/415 |
| 6,927,579 B2 | 8/2005 | Blades | |
| 7,148,696 B2 | 12/2006 | Zhou et al. | |
| 7,463,037 B2 | 12/2008 | Henson et al. | |
| 8,040,517 B1 | 10/2011 | Wu et al. | |
| 8,474,320 B2 | 7/2013 | Kordon et al. | |
| 2006/0164097 A1 | 7/2006 | Zhou et al. | |
| 2006/0254355 A1 | 11/2006 | Zhou | |
| 2007/0183103 A1 | 8/2007 | Sung | |
| 2007/0208520 A1 | 9/2007 | Zhang | |
| 2011/0125419 A1* | 5/2011 | Bechhoefer | F03D 7/047 702/34 |
| 2011/0267721 A1 | 11/2011 | Chaintreuil et al. | |
| 2012/0095706 A1 | 4/2012 | Zhou et al. | |
| 2014/0015523 A1* | 1/2014 | Rupf | G01R 33/04 324/244 |
| 2014/0112041 A1 | 4/2014 | Collin et al. | |
| 2014/0301008 A1 | 10/2014 | Gouy-Pailler et al. | |
| 2015/0061696 A1 | 3/2015 | Dahmani et al. | |
| 2016/0003886 A1 | 1/2016 | Djeddi | |
| 2016/0187409 A1 | 6/2016 | Kolker et al. | |
| 2016/0320442 A1 | 11/2016 | Perichon | |
| 2016/0341782 A1 | 11/2016 | Huang et al. | |
| 2017/0331273 A1 | 11/2017 | Lee | |

FOREIGN PATENT DOCUMENTS

| | | |
|---|---|---|
| FR | 3015045 A1 | 6/2015 |
| WO | 2007106253 A1 | 9/2007 |
| WO | 2013150157 A1 | 10/2013 |

OTHER PUBLICATIONS

Swedan, A. et al.; Enhancement of acoustic based partial discharge detection using pattern recognition techniques; Electric Power and Energy Conversion Systems (EPECS), 2011 2nd International Conference On; IEEE; Nov. 15, 2011.

Kundu, P. et al.; Frequency domain analysis of acoustic emission signals for classification of partial discharges; Electric Insulation and Dielectric Phenomena, 2007. CEIDP 2007. Annual Report—Conference On; IEEE; Oct. 14, 2007.

Boczar, Tomasz et al.; The Application of Modern Signal Processing Methods in the Acoustic Emission Method for the Measurement of Insulation Systems of Power Transformers; European Conference on Non Destructive Testing; Sep. 25, 2006.

Preliminary Search Report in French Patent Application No. 1655981; dated Feb. 28, 2017, 2 pages.

* cited by examiner

METHOD OF DETECTING AN ELECTRIC ARC BY ANALYSIS OF ITS ACOUSTIC SIGNATURE

CROSS-REFERENCE TO RELATED APPLICATION

This application claims the priority benefit of French patent application number 15/63381, filed on Dec. 28, 2015, the content of which is hereby incorporated by reference in its entirety to the maximum extent allowable by law.

BACKGROUND

The present disclosure relates to a method of detecting the forming of an electric arc in an electrical system from its acoustic signature.

DISCUSSION OF THE RELATED ART

In many electrical systems, especially high-voltage systems such as electrical cabinets, transformers, electric batteries, electric distribution networks, etc., electric arcs may form, for example due to an overvoltage or to a failure such as the breakage of a cable or the wearing of an insulator. If it is sustained, an electric arc may cause serious damage and particularly cause the starting of a fire. Electric arcs are particularly dangerous in DC power supply electrical systems, since one cannot rely on a "natural" zero crossing of the power supply voltage to extinguish the arc. The early detection of the forming of an electric arc is a major issue for the security of many electrical systems.

Various solutions have been provided to detect the forming of an electric arc in an electrical system. Detection methods based on current and voltage measurements in the system, detection methods based on optical signal measurements, detection methods based on electromagnetic signal measurements, and detection methods based on acoustic signal measurements have in particular been provided.

Detection methods based on acoustic signal measurements are here more particularly considered.

SUMMARY

Thus, an embodiment provides a method of detecting an electric arc in an electrical system from a signal originating from at least one sensor detecting acoustic waves in the system, comprising: a) calculating by means of a processing device, over a sliding window of signal samples, at least one statistical parameter selected from the skewness and the kurtosis of the signal; b) detecting a possible occurrence of an event by taking into account said at least one statistical parameter; and c) performing a frequency analysis of the signal enabling to identify an electric arc when an event is detected at step b).

According to an embodiment, step b) comprises detecting a peak or an amplitude variation characteristic of said at least one statistical parameter.

According to an embodiment, the method further comprises calculating a quantity representative of the instantaneous energy of the signal.

According to an embodiment, at step b), said quantity representative of the instantaneous energy of the signal is taken into account to detect a possible occurrence of an event.

According to an embodiment, step c) comprises calculating the $3^{rd}$-order derivative of the signal, and searching for a characteristic peak in the differentiated signal.

According to an embodiment, step c) comprises calculating the spectral power density of the signal.

According to an embodiment, step c) comprises calculating a quantity representative of the energy of the signal in a spectral band characteristic of electric arcs, and detecting the possible crossing of an energy threshold in this band.

According to an embodiment, the quantity representative of the energy of the signal in a spectral band characteristic of electric arcs is normalized with respect to a quantity representative of the energy of the signal in another spectral band.

Another embodiment provides a calculation device for detecting an electric arc in an electrical system from a signal originating from at least one sensor detecting acoustic waves in the system, comprising a processing device arranged to: a) calculate by means of a processing device, over a sliding window of signal samples, at least one statistical parameter selected from the skewness and the kurtosis of the signal; b) detect a possible occurrence of an event by taking into account said at least one statistical parameter; and c) perform a frequency analysis of the signal enabling to identify an electric arc when an event is detected at step b).

Another embodiment provides a system comprising: an electrical system; at least one sensor arranged to detect acoustic waves in the electrical system; and a calculation device such as defined hereabove arranged to process an output signal of the sensor.

The foregoing and other features and advantages will be discussed in detail in the following non-limiting description of specific embodiments in connection with the accompanying drawings.

DETAILED DESCRIPTION OF THE PRESENT EMBODIMENTS

Figure 1:
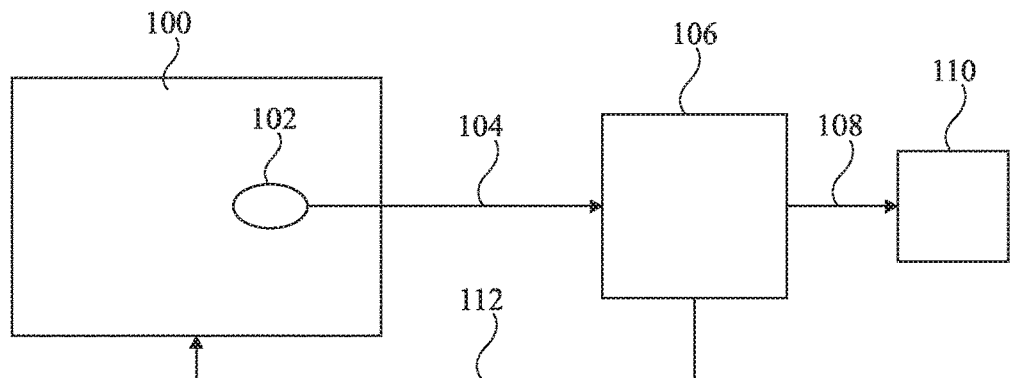
FIG. 1 illustrates an electrical system provided with an electric arc detection device according to an embodiment.

The same elements have been designated with the same reference numerals in the different drawings. For clarity, only those elements which are useful to the understanding of the described embodiments have been shown and detailed. In particular, the electrical systems where electric arcs are desired to be detected have not been detailed, the described detection solutions being compatible with any electrical system where electric arcs may occur.

FIG. 1 shows an electrical system 100 to be monitored, for example, an electrical cabinet, an electric power distribution network in an airplane, an electric battery, or any other electrical system where the possible occurrence of an electric arc is desired to be detected.

Electrical system 100 is equipped with an electric arc detection device comprising an acoustic sensor 102, for example, an ultrasound sensor, capable of detecting acoustic waves in electrical system 100. The forming of an electric arc indeed goes along with the emission of characteristic acoustic waves, the detection of which may enable to identify the presence of the arc. Sensor 102 may be arranged on a wall of a casing of electrical system 100, or in physical contact with an electric conductor which is particularly desired to be monitored. Although a single sensor 102 is illustrated in FIG. 1, in alternative embodiments, a plurality of sensors 102 may be provided to monitor different portions of system 100. The output of each sensor 102 is for example processed separately, similarly or identically to what will be described in further detail hereafter.

Sensor 102 supplies an output signal 104 to a calculation device 106 of the electric arc detection device. As an example, output signal 104 of sensor 102 is a digital signal, and calculation device 106 is a digital processing circuit, for example comprising a microprocessor. Output signal 104 is a signal in the time domain, representing the time variation of the amplitude of the acoustic waves sensed by sensor 102. Calculation device 106 is capable of analyzing the signal supplied by sensor 102 to detect the possible presence of an electric arc in system 100.

Calculation device 106 for example supplies an output signal 108 to an output unit 110 of the electric arc detection device, which may be an alarm, a display, or any other interface element enabling to inform a user of the presence of an arc in system 100.

Calculation device 106 may supply, in addition to or instead of output signal 108, an output signal 112 sent to system 100, which may for example control the setting of system 100 to a safe mode when an electric arc is detected, for example, by interruption of the power supply current in all or part of system 100.

The implementation of a robust electric arc detection based on the acoustic signature thereof involves a frequency analysis of the acoustic signals detected by sensor 102. Indeed, the detection of acoustic energy peaks in specific frequency bands, for example, between 80 and 120 kHz, provides good electric arc detection performances and enables to minimize risks of false detection due to other phenomena capable of generating acoustic signals, for example, mechanical shocks. The real-time frequency analysis of the output signal of sensor 102 however requires significant calculation resources, and results in a high electric power consumption of calculation device 106.

Figure 2:
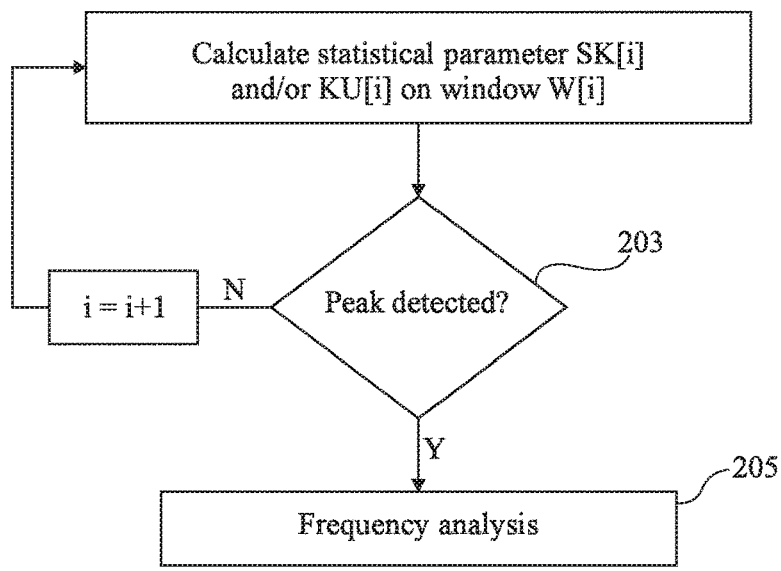
FIG. 2 is a timing diagram illustrating steps of a method of detecting an electric arc according to an embodiment.

FIG. 2 is a timing diagram illustrating steps of an electric arc detection method according to an embodiment. This method may be implemented by calculation device 106 of the electric arc detection device of FIG. 1 to perform a continuous monitoring of system 100 and detect as soon as possible the forming of an electric arc. An advantage of the method of FIG. 2 is its relatively low calculation complexity, which particularly enables to limit the electric power consumption of calculation device 106.

The method of FIG. 2 comprises a step 201 of calculating, over a window W[i] of consecutive samples of output signal 104 of sensor 102, at least one of the following statistical parameters of signal 104: the skewness; and the kurtosis.

The skewness SK[i] and the kurtosis KU[i] of signal 104 in window W[i] may be defined as follows:

$$SK[i] = \sum_{j=1}^{n} \frac{(y_j - \bar{y})^3 / n}{s^3}$$

$$KU[i] = \sum_{j=1}^{n} \frac{(y_j - \bar{y})^4 / n}{s^4}$$

where n is the number of samples of window W[i], j is an integer in the range from 1 to n, $y_j$ is the value of the sample of rank j of window W[i], $\bar{y}$ is the average of the n samples $y_j$ of window W[i], and s is the standard deviation of the n samples $y_j$ of window W[i].

Window W[i] is a sliding window, and the calculation of statistical parameters SK[i] and/or KU[i] may be performed in real time as the samples arrive. As an illustration, window W[i] comprises n=2,000 samples and the sampling period of signal 104 is equal to 1 μs, so that each window W[i] covers a 2-ms period. The sliding step of the window is for example of 1 sample, that is, window W[i+1] contains the n−1 last samples $y_j$ of window W[i], plus an additional sample consecutive to the last sample $y_n$ of window W[i].

The inventors have observed that the forming of an electric arc in system 100 causes the occurrence of a peak or of a strong amplitude variation in one and/or the other of statistic signals SK[i] and KU[i].

Thus, the method of FIG. 2 comprises a step 203 of detection of a peak or of a strong amplitude variation in statistic signal SK[i] and/or KU[i]. As an example, step 203 may comprise, after the step of calculating statistical parameter SK[i] and/or KU[i], a step of detecting the possible crossing of a high or low threshold by statistical parameter SK[i] and/or KU[i].

If no peak and no significant amplitude variation are detected at step 203, steps 201 and 203 are implemented again for the next window W[i+1] of signal 104.

If a peak or a strong amplitude variation of statistical parameter SK[i] and/or KU[i] are detected at step 203, the detection device can deduce therefrom that an event capable of corresponding to the forming of an electric arc has occurred in system 100. The statistical analysis alone of signal 104 however does not enable to determine with certainty that the detected event corresponds to the occurrence of an electric arc. Indeed, the peak detected in signal SK[i] and/or KU[i] may be caused by other events, such as a mechanical shock. Thus, when an event capable of corresponding to an electric arc is detected from statistical signal SK[i] and/or KU[i] at step 203, the method of FIG. 2 implements, at a step 205, a frequency analysis of signal 104, enabling to discriminate the forming of an electric arc from among different types of events. Examples of methods of frequency analysis of signal 104 capable of being implemented at step 205 will be described hereafter.

When an electric arc is detected during frequency analysis step 205, an output signal signaling this detection may be generated, for example, to trigger an alarm and/or the setting of electrical system 100 to a safe mode.

An advantage of the method of FIG. 2 is that in the absence of a remarkable event in system 100, its calculation complexity is limited to the implementation of a calculation of one or a plurality of statistical parameters of signal 104 in the time domain. Only when a remarkable event is detected from this statistical analysis of signal 104 is a frequency analysis (potentially with heavier calculations) implemented to enable to more finely discriminate an electric arc from among different types of events, and thus limit risks of false detections. Such an approach enables to decrease the general electric power consumption of the electric arc detection device.

It should be noted that at time 203, the detection of an event may be performed from parameter SK[i] only, from parameter KU[i] only, or from the two parameters SK[i] and KU[i]. As an example, the implementation of a frequency analysis of signal 104 may be triggered when a peak or a significant amplitude variation are detected in signal SK[i], or when a peak or a significant amplitude variation are detected in signal KU[i], or when a peak or a significant amplitude variation are detected in the generated signal SK[i]*KU[i].

In addition to statistical parameters SK[i] and/or KU[i], the detection of an event capable of corresponding to an electric arc may be based on other characteristic quantities of signal 104, for example, on the instantaneous energy of signal 104. As an example, step 201 may further comprise, for each sample of signal 104, calculating the instantaneous energy of signal 104 normalized with respect to the standard deviation of the acoustic noise, defined as follows:

$$EIN[i] = \frac{|y_i - \mu_{noise}|}{\sigma_{noise}}$$

where $\sigma_{noise}$ is the standard deviation of the acoustic noise measured by sensor 102 over a reference window in the absence of any remarkable event (electric arc, mechanical shock, etc.) capable of generating acoustic waves, and where $\mu_{noise}$ is the average of the acoustic noise in this same reference window.

At step 203, it can then for example be considered that a remarkable event capable of corresponding to an electric arc has occurred, and it may accordingly be decided to implement step 205 of frequency analysis of signal 104, when a peak or a significant amplitude variation have been detected in statistical signal SK[i] and/or KU[i], and that normalized instantaneous energy EIN[i] of the current sample is greater than a threshold S. Threshold S is for example in the range from $4*\sigma_{noise}$ to $6*\sigma_{noise}$, for example, equal to $5*\sigma_{noise}$.

Frequency Analysis—First Example

In this example, step 205 comprises calculating the $3^{rd}$-order derivative of signal 104. The operation of $3^{rd}$-order differentiation of signal 104 corresponds to a high-pass filtering of signal 104. Such an operation provides a good compromise between the calculation complexity and the electric arc detection/discrimination efficiency. The $3^{rd}$-order derivative of signal 104 exhibits a remarkable peak in the presence of an electric arc, and exhibits no peak in the presence of a mechanical shock. Thus, step 205 may comprise searching for a possible peak characteristic of an electric arc in signal 104. As an example, the calculation of the $3^{rd}$-order derivative of signal 104 and the search of a possible peak in the derived signal may be implemented on the same window W[i] of samples of signal 104 than that having led to detecting a remarkable event at step 203, and/or on the next windows. The described embodiments are however not limited to this specific case.

Frequency Analysis—Second Example

In this example, step 205 comprises a conversion of time signal 104 supplied by sensor 102 in the frequency domain. To achieve this, step 205 for example comprises calculating a short-time Fourier transform or STFT over a window of consecutive samples of signal 104, for example, the same window W[i] of samples of signal 104 as that which has led to detecting a remarkable event at step 203. The spectral power density or DSP in the processing window can then be estimated, for example, by calculating the square module of the STFT normalized with respect to the total energy of the processed window. Knowing the frequency bands of the acoustic waves generated by an electric arc, it is then possible to efficiently detect/discriminate an electric arc from among different types of events. As an example, step 205 may comprise calculating the energy of signal 104 in a spectral band characteristic of electric arcs, for example, the band from 80 to 120 kHz, and detecting the possible crossing of an energy threshold in this band. The spectral processing of signal 104 may be carried on by sliding the processing window to construct the spectrogram of signal 104, that is, an array where each column contains the DSP of signal 104 for a time window of samples of signal 104. The spectrogram calculation enables to follow the time variation of the spectrum of signal 104, which enables to further improve the electric arc detection/discrimination performances. Step 205 may in particular comprise analyzing the time variation of the energy of signal 104 in one or a plurality of specific spectral bands. Such an analysis may be carried out differentially, for example, by comparing the energy of signal 104 in a spectral band characteristic of electric arcs with the energy of signal 104 in one or a plurality of other spectral bands.

The STFT calculated at step 205 may be defined as follows:

$$STFT\{x[n]\}(m, \omega) = X[m, \omega] = \sum_{n=-\infty}^{+\infty} x[n] - \text{wind}[n-m].e^{-j\omega n}$$

where $X[m,\omega]$ is the STFT, m and $\omega$ are the variables discretized for time (m) and frequency ($\omega$) of the STFT, x[n] is the signal over time, n is the discrete time, and wind[ ] is the sliding window used to select and weight the subset of samples having the STFT estimated thereon.

For a determined time m, the DSP calculated at step 205 may be defined as follows:

$$P_{X,norm}(\omega) = \frac{|X[\omega]|^2}{\sum_{\omega=0}^{\omega s/2} |X[\omega]|^2}$$

where $X[\omega]$ is the STFT for a determined time m, and where the sum at the denominator corresponds to the total energy of the signal contained in the band from 0 to $\omega s/2$, with $\omega s = 2\pi fs$, fs being the sampling frequency of signal 104.

Figure 3:
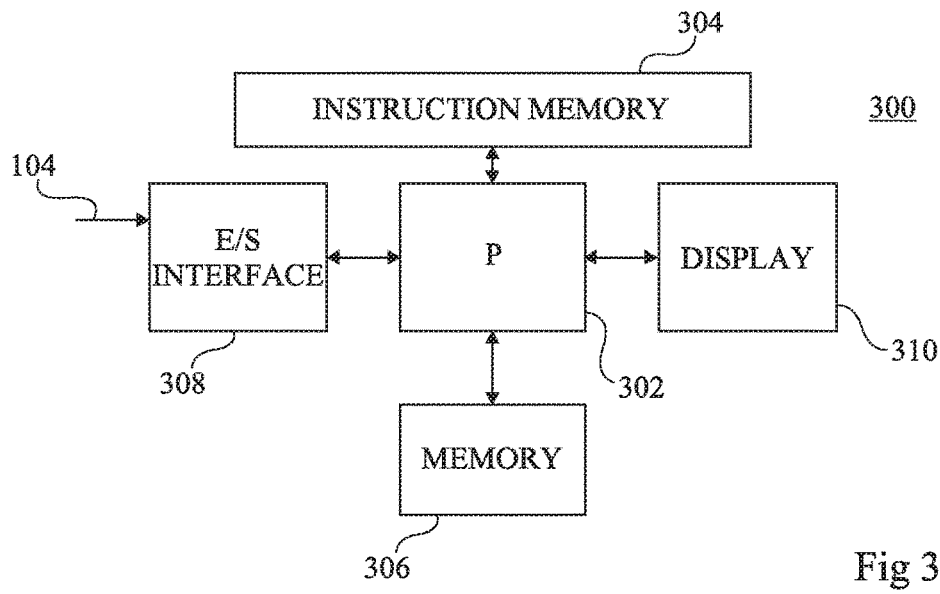
FIG. 3 illustrates a device capable of implementing an electric arc detection method according to an embodiment.

FIG. 3 illustrates an example of a processing device 300 of calculation device 106 of FIG. 1. Processing device 300 is arranged to implement the above-described electric arc detection method. Device 300 may comprise one or a plurality of processors 302 (P) receiving instructions stored in an instruction memory 304. Processing device 300 may further comprise a memory 306 configured to store the different quantities calculated during the implementation of the electric arc detection method, for example, statistical parameters SK[i] and/or KU[i], possibly instantaneous energy EIN[i], possibly the $3^{rd}$-order derivative of signal 104, possibly the STFTs and the DSPs of signal 104, etc. Memory 306 may further store time-variable signal 104 originating from sensor 102, which is for example received by processor 302 via an input/output interface 308. Input/output interface 308 may further supply output signal 112 of device 106 capable of controlling the operation of electrical system 100 in the case where an electric arc is detected. Processing device 300 for example further comprises a display 310, which for example provides a user interface and means for alerting a user if an electric arc is detected.

Specific embodiments have been described. Various alterations, modifications, and improvements will occur to those skilled in the art. In particular, the described embodiments are not limited to the above-described examples of methods of frequency analysis of signal 104 (step 205 of the method of FIG. 2). More generally, any other frequency analysis method enabling to detect an electric arc from its acoustic signature may be implemented during step 205 of the method of FIG. 2.

Further, the electric arc detection method described in relation with FIG. 2 may comprise optional additional steps to improve its performances. As an example, a pre-processing of signal 104 may be implemented, comprising performing a band-pass filtering of the signal, according to a bandwidth including the typical emission frequencies of electric arcs and of mechanical shocks, to decrease the energy contribution of the noise. It should be noted that the inclusion in the bandwidth of the filter for pre-processing the characteristic frequencies of mechanical shocks (in addition to the characteristic frequencies of electric arcs) is optional, but has the advantage of enabling to implement an arc detection by differential analysis (difference between the energy at the characteristic frequencies of arcs and the energy at the characteristic frequencies of shocks).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A system comprising an electrical system having a conductor, at least one sensor arranged to detect acoustic waves in the electrical system, and a calculation device for detecting an electric arc by the conductor in the electrical system from a signal originating from the at least one sensor, the calculation device comprising a processing device arranged to implement the following steps:
   a) calculating, over a sliding window of samples of the signal, at least one statistical parameter selected from the skewness and the kurtosis of the signal;
   b) detecting a possible occurrence of an event by taking into account said at least one statistical parameter; and
   c) performing a frequency analysis of the signal enabling to identify the electric arc, only when the event is detected at step b), thereby decreasing processing required by the processing device,
   where the frequency analysis of the signal comprises calculating spectral power density of the signal by calculating a quantity representative of the energy of the signal in a spectral band characteristic of electric arcs, and detecting possible crossing of an energy threshold in this band, and where the quantity representative of the energy of the signal in the spectral band characteristic of electric arcs is normalized with respect to a quantity representative of the energy of the signal in another spectral band.

2. The system of claim 1, wherein step b) comprises detecting a peak or an amplitude variation characteristic of said at least one statistical parameter.

3. The system of claim 1, wherein the processing device is further arranged to calculate a quantity representative of h-instantaneous energy of the signal.

4. The system of claim 3, wherein, at step b), said quantity representative of instantaneous energy of the signal is taken into account to detect the possible occurrence of the event.

5. The system of claim 1, wherein step c) comprises calculating a $3^{rd}$-order derivative of the signal, and searching for a characteristic peak in the derived signal.

6. A method of detecting an electric arc by a conductor in an electrical system comprising the conductor from a signal originating from at least one sensor detecting acoustic waves in the electrical system, the method comprising:
   a) calculating, by a processing device, over a sliding window of samples of the signal, at least one statistical parameter selected from the skewness and the kurtosis of the signal;
   b) detecting, by the processing device, a possible occurrence of an event by taking into account said at least one statistical parameter; and
   c) performing, by the processing device, a frequency analysis of the signal enabling to identify the electric arc only when the event is detected at step b), thereby decreasing processing required by the processing device,
   where the frequency analysis of the signal comprises calculating spectral power density of the signal by calculating a quantity representative of the energy of the signal in a spectral band characteristic of electric arcs, and detecting possible crossing of an energy threshold in this band, and where the quantity representative of the energy of the signal in the spectral band characteristic of electric arcs is normalized with respect to a quantity representative of the energy of the signal in another spectral band.

7. The method of claim 6, wherein step b) comprises detecting a peak or an amplitude variation characteristic of said at least one statistical parameter.

8. The method of claim 6, further comprising calculating, by the processing device, a quantity representative of instantaneous energy of the signal.

9. The method of claim 8, wherein, at step b), said quantity representative of instantaneous energy of the signal is taken into account to detect the possible occurrence of the event.

10. The method of claim 6, wherein step c) comprises calculating a 3rd-order derivative of the signal, and searching for a characteristic peak in the derived signal.

* * * * *